(12) United States Patent
McBride et al.

(10) Patent No.: US 10,540,584 B2
(45) Date of Patent: Jan. 21, 2020

(54) QUEUE MANAGEMENT FOR DIRECT MEMORY ACCESS

(71) Applicant: Microsoft Technology Licensing, LLC, Redmond, WA (US)

(72) Inventors: Chad Balling McBride, North Bend, WA (US); Amol Ashok Ambardekar, Redmond, WA (US); Kent D. Cedola, Bellevue, WA (US); George Petre, Redmond, WA (US); Larry Marvin Wall, Seattle, WA (US); Boris Bobrov, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/702,311

(22) Filed: Sep. 12, 2017

(65) Prior Publication Data

US 2018/0300634 A1 Oct. 18, 2018

Related U.S. Application Data

(60) Provisional application No. 62/486,432, filed on Apr. 17, 2017.

(51) Int. Cl.
*G06N 3/04* (2006.01)
*G06F 3/06* (2006.01)
(Continued)

(52) U.S. Cl.
CPC .............. *G06N 3/04* (2013.01); *G06F 1/324* (2013.01); *G06F 1/3275* (2013.01);
(Continued)

(58) Field of Classification Search
CPC ......... G06F 3/061; G06F 3/064; G06F 3/0656
(Continued)

(56) References Cited

U.S. PATENT DOCUMENTS 4,298,954 A * 11/1981 Bigelow .................. G06F 5/16
710/53
5,091,864 A 2/1992 Baji et al.
(Continued)

FOREIGN PATENT DOCUMENTS

EP 0147857 A2 7/1985
EP 2945290 A2 11/2015
(Continued)

OTHER PUBLICATIONS

Chi, et al., "PRIME: A Novel Processing-in-memory Architecture for Neural Network Computation in ReRAM-based Main Memory", In Proceedings of ACM/IEEE 43rd Annual International Symposium on Computer Architecture, Jun. 18, 2016, 13 pages.
(Continued)

*Primary Examiner* — Faisal M Zaman
(74) *Attorney, Agent, or Firm* — Newport IP, LLC; Tim R. Wyckoff; Scott Y. Shigeta

(57) ABSTRACT

A direct memory access (DMA) engine may be responsible to enable and control DMA data flow within a computing system. The DMA engine moves blocks of data, associated with descriptors in a plurality of queues, from a source to a destination memory location or address, autonomously from control by a computer system's processor. Based on analysis of the data blocks linked to the descriptors in the queues, the DMA engine and its associated DMA fragmenter ensure that data blocks stored linked to descriptors in the queues do not remain idle for an exorbitant period of time. The DMA fragmenter may divide large data blocks into smaller data blocks to ensure that the processing of large data blocks does not preclude the timely processing of smaller data blocks associated with one or more descriptors in the queues. The data blocks stored may be two-dimensional data blocks.

17 Claims, 6 Drawing Sheets

(51) Int. Cl.

| | | |
|---|---|---|
| *G06N 3/063* | (2006.01) | |
| *G06N 3/10* | (2006.01) | |
| *G06N 3/08* | (2006.01) | |
| *G06F 9/38* | (2018.01) | |
| *G06N 3/06* | (2006.01) | |
| *H04L 12/715* | (2013.01) | |
| *G06F 12/10* | (2016.01) | |
| *G06F 13/16* | (2006.01) | |
| *G06F 1/324* | (2019.01) | |
| *G06F 15/80* | (2006.01) | |
| *G06F 1/3234* | (2019.01) | |
| *G06F 12/02* | (2006.01) | |
| *G06F 13/28* | (2006.01) | |
| *G06F 17/15* | (2006.01) | |
| *H03M 7/30* | (2006.01) | |
| *G06F 12/08* | (2016.01) | |
| *H04L 29/08* | (2006.01) | |
| *H04L 12/723* | (2013.01) | |

(52) U.S. Cl.
CPC ............ *G06F 3/0604* (2013.01); *G06F 3/067* (2013.01); *G06F 3/0631* (2013.01); *G06F 9/3887* (2013.01); *G06F 12/0207* (2013.01); *G06F 12/08* (2013.01); *G06F 12/10* (2013.01); *G06F 13/1673* (2013.01); *G06F 13/1689* (2013.01); *G06F 13/28* (2013.01); *G06F 15/8007* (2013.01); *G06F 17/15* (2013.01); *G06N 3/049* (2013.01); *G06N 3/06* (2013.01); *G06N 3/063* (2013.01); *G06N 3/0635* (2013.01); *G06N 3/08* (2013.01); *G06N 3/10* (2013.01); *H03M 7/6005* (2013.01); *H03M 7/6011* (2013.01); *H03M 7/70* (2013.01); *H04L 45/04* (2013.01); *H04L 67/02* (2013.01); *H04L 67/1002* (2013.01); *G06F 2212/657* (2013.01); *H04L 45/50* (2013.01)

(58) Field of Classification Search
USPC ........... 711/171; 710/22, 310, 33, 52, 56, 60
See application file for complete search history.

(56) References Cited

U.S. PATENT DOCUMENTS

| | | | |
|---|---|---|---|
| 5,487,153 A | 1/1996 | Hammerstrom et al. | |
| 5,524,175 A | 6/1996 | Sato et al. | |
| 5,644,749 A | 7/1997 | Obayashi | |
| 5,859,990 A * | 1/1999 | Yarch | G06F 13/28 710/33 |
| 5,933,654 A * | 8/1999 | Galdun | G06F 13/28 710/22 |
| 6,307,867 B1 * | 10/2001 | Roobol | H04J 3/1647 370/342 |
| 6,654,730 B1 | 11/2003 | Kato et al. | |
| 6,785,239 B1 | 8/2004 | Tasker | |
| 6,990,079 B2 | 1/2006 | Vrabel | |
| 7,012,893 B2 | 3/2006 | Bahadiroglu | |
| 7,539,608 B1 | 5/2009 | Dageville et al. | |
| 8,244,953 B1 * | 8/2012 | Kumar | G11B 5/09 360/27 |
| 8,442,927 B2 | 5/2013 | Chakradhar et al. | |
| 9,851,771 B2 | 12/2017 | Cooper et al. | |
| 9,990,307 B1 * | 6/2018 | Patel | G06F 12/1081 |
| 10,275,001 B2 | 4/2019 | Kam et al. | |
| 2002/0133648 A1 * | 9/2002 | Goudie | H04L 49/90 710/56 |
| 2003/0065631 A1 | 4/2003 | Mcbride | |
| 2003/0120799 A1 * | 6/2003 | Lahav | H04J 3/1611 709/236 |
| 2003/0200315 A1 * | 10/2003 | Goldenberg | H04L 47/10 709/225 |
| 2004/0187135 A1 | 9/2004 | Pronovost et al. | |
| 2005/0204189 A1 * | 9/2005 | Akiba | G06F 1/3206 714/12 |
| 2005/0216616 A1 * | 9/2005 | Eldar | G06F 13/102 710/52 |
| 2006/0047864 A1 | 3/2006 | Brokenshire et al. | |
| 2007/0145151 A1 * | 6/2007 | Nakamura | G06F 3/0613 235/492 |
| 2008/0043742 A1 | 2/2008 | Pong et al. | |
| 2008/0052441 A1 * | 2/2008 | Freking | G06F 13/385 710/310 |
| 2008/0112438 A1 * | 5/2008 | Ying | H04L 7/0337 370/505 |
| 2008/0313385 A1 * | 12/2008 | Vijayakumar | G06F 3/0613 711/100 |
| 2008/0319933 A1 | 12/2008 | Moussa et al. | |
| 2009/0037697 A1 * | 2/2009 | Ramani | G06F 9/3834 712/214 |
| 2009/0313195 A1 | 12/2009 | Mcdaid et al. | |
| 2010/0180100 A1 | 7/2010 | Lu et al. | |
| 2010/0257174 A1 | 10/2010 | Minuti | |
| 2010/0281192 A1 * | 11/2010 | Rakib | G06F 5/08 710/52 |
| 2011/0246722 A1 * | 10/2011 | Taha | G06F 12/0862 711/137 |
| 2012/0130928 A1 | 5/2012 | Bell et al. | |
| 2012/0134449 A1 * | 5/2012 | Chen | H04L 1/0052 375/340 |
| 2014/0046882 A1 | 2/2014 | Wood | |
| 2014/0181464 A1 | 6/2014 | Forsyth et al. | |
| 2014/0281221 A1 * | 9/2014 | Wang | G06F 3/065 711/114 |
| 2014/0372670 A1 * | 12/2014 | Vasilyuk | G06F 12/0246 711/103 |
| 2015/0363239 A1 | 12/2015 | Hsu et al. | |
| 2016/0098388 A1 * | 4/2016 | Blevins | G06F 17/30569 707/755 |
| 2016/0184587 A1 * | 6/2016 | Heuvel | A61N 1/37264 600/25 |
| 2016/0328644 A1 | 11/2016 | Lin et al. | |
| 2016/0335119 A1 | 11/2016 | Merrill et al. | |
| 2017/0011288 A1 | 1/2017 | Brothers et al. | |
| 2018/0299943 A1 | 10/2018 | Mcbride et al. | |
| 2018/0300601 A1 | 10/2018 | Cedola et al. | |
| 2018/0300602 A1 | 10/2018 | Petre et al. | |
| 2018/0300603 A1 | 10/2018 | Ambardekar et al. | |
| 2018/0300604 A1 | 10/2018 | Mcbride et al. | |
| 2018/0300605 A1 | 10/2018 | Ambardekar et al. | |
| 2018/0300606 A1 | 10/2018 | Corkery et al. | |
| 2018/0300607 A1 | 10/2018 | Petre et al. | |
| 2018/0300613 A1 | 10/2018 | Petre et al. | |
| 2018/0300614 A1 | 10/2018 | Ambardekar et al. | |
| 2018/0300615 A1 | 10/2018 | Ambardekar et al. | |
| 2018/0300616 A1 | 10/2018 | Ambardekar et al. | |
| 2018/0300617 A1 | 10/2018 | Mcbride et al. | |
| 2018/0300633 A1 | 10/2018 | Mcbride et al. | |

FOREIGN PATENT DOCUMENTS

| | | |
|---|---|---|
| EP | 3035204 A1 | 6/2016 |
| EP | 3035249 A1 | 6/2016 |
| WO | 1993014459 A1 | 7/1993 |
| WO | 2016118257 A1 | 7/2016 |
| WO | 2016210030 A1 | 12/2016 |

OTHER PUBLICATIONS

"International Search Report and Written Opinion Issued in PCT Application No. PCT/US2018/026352", dated Jun. 27, 2018, 11 Pages.

"International Search Report and Written Opinion Issued in PCT Application No. PCT/US2018/026353", dated Jul. 6, 2018, 15 Pages.

(56) References Cited

OTHER PUBLICATIONS

"International Search Report and Written Opinion Issued in PCT Application No. PCT/US2018/026354", dated Jul. 31, 2018, 15 Pages.
"International Search Report and Written Opinion Issued in PCT Application No. PCT/US2018/026355", dated Jul. 9, 2018, 16 Pages.
"International Search Report and Written Opinion Issued in PCT Application No. PCT/US2018/026356", dated Jul. 6, 2018, 16 Pages.
"International Search Report and Written Opinion Issued in PCT Application No. PCT/US2018/026357", dated Jul. 9, 2018, 16 Pages.
"International Search Report and Written Opinion Issued in PCT Application No. PCT/US2018/026358", dated Jul. 11, 2018, 15 Pages.
"International Search Report & Written Opinion Issued in PCT Patent Application No. PCT/US18/027674", dated Jul. 13, 2018, 13 Pages.
"International Search Report & Written Opinion Issued in PCT Patent Application No. PCT/US18/027680", dated Sep. 27, 2018, 13 Pages.
"International Search Report & Written Opinion Issued in PCT Patent Application No. PCT/US18/027828", dated Aug. 3, 2018, 11 Pages.
"International Search Report & Written Opinion Issued in PCT Patent Application No. PCT/US18/027834", dated Jul. 24, 2018, 11 Pages.
"International Search Report & Written Opinion Issued in PCT Patent Application No. PCT/US18/027836", dated Aug. 3, 2018, 14 Pages.
"International Search Report & Written Opinion Issued in PCT Patent Application No. PCT/US18/027837", dated Aug. 3, 2018, 10 Pages.
"International Search Report & Written Opinion Issued in PCT Patent Application No. PCT/US18/027840", dated Jul. 30, 2018, 9 Pages.
"Ex Parte Quayle Action Issued in U.S. Patent Appl. No. 15/950,644", Mailed Date: Sep. 23, 2019, 7 Pages.

* cited by examiner

QUEUE MANAGEMENT FOR DIRECT MEMORY ACCESS

PRIORITY APPLICATION

This application claims the benefit of and priority to U.S. Provisional Application No. 62/486,432 filed Apr. 17, 2017, the entire contents of which are incorporated herein by reference.

BACKGROUND

An important operational aspect of a computer or of a computer system is the need to transfer data to and from the memory of the computer. However, if the computer's processor is used to perform the task of transferring data to and from the computer's memory, then the processor is unable to perform other functions. When a computer is supporting high speed devices that have significant memory needs, the processor bears a heavy load if the processor is required to copy data word by word to and from the computer's memory system for those devices. As a result, using the processor to transfer data in this manner can consume precious processing time.

Real time multimedia applications are becoming increasingly important. These multimedia applications may require extremely fast processing speeds, and data transfer speeds, such as many thousands of megabits of data per second. While some processing systems employ a single processor to achieve fast processing speeds, others are implemented utilizing multiprocessor architectures. In multiprocessor systems, a plurality of sub processors can operate in parallel (or at least in concert) to achieve desired processing results.

In recent years, there has been an insatiable desire for faster computer processing data throughputs because cutting edge computer applications are becoming more and more complex, and are placing ever increasing demands on processing systems. Graphics applications are among those that place the highest demands on a processing system because they require such vast numbers of data accesses, data computations, and data manipulations in relatively short periods of time to achieve desirable results.

A solution to the need for faster computer processing data throughputs is direct memory access (DMA). DMA techniques may be employed where the computer architecture allows data to be sent directly between a source device and a destination device without involving any processor(s) in the data transfer. The architecture usually includes a controller that receives data transfer commands from the device(s) of the system to cause the transfer of data. A conventional DMA command may specify a data block size, an address within the system memory from/to which data is to be transferred, and a start address of the device to/from which data is to be transferred. In this manner, data may be rapidly transmitted between a specified device and a specified memory without burdening a microprocessor.

Conventional DMA techniques may perform processing on a plurality of queues. In one example, a first queue may include descriptors identifying DMA data that is to be moved from a source device to a destination device, and a second queue may include DMA instruction descriptors that pertain to instruction or command data. In some implementations, a size of the data processed by the descriptors in the first queue is greater than a size of the instruction data processed by the descriptors in the second queue. Therefore, in some circumstances, DMA techniques may initiate processing DMA data based on one or more descriptors in the first queue while pausing processing of the instruction data associated with the descriptors in the second queue. However, the second queue may have to be paused for an exorbitant period of time to allow DMA techniques to complete the processing of data associated with the descriptors in the first queue. Forcing the second queue to remain idle while the first queue is processed may diminish the data transfer efficiency of conventional DMA techniques.

It is with respect to these considerations and others that the disclosure made herein is presented.

SUMMARY

Techniques described herein provide for efficient arbitration of direct memory access (DMA) queues. In some implementations, a computing device or computing system may implement a plurality of queues. Each of the plurality of queues may include instructions, such as descriptors, for processing data. In some implementations, a first of the plurality of queues relates to and includes instructions for processing data that is larger than data that is to be processed in accordance with instructions in a second of the plurality of queues.

The techniques described herein may implement a DMA engine that interfaces with the DMA queues. The DMA engine may employ a DMA data arbiter and a DMA fragmenter. The DMA data arbiter may be functional to regulate data that is processed in accordance with instructions in the first queue and the second queue. Furthermore, the DMA data arbiter may be functional to regulate data that is processed in accordance with instructions of other queues of the plurality of queues. The data instructions included in the plurality of queues may be referred to as descriptors.

The DMA data arbiter may be responsible to ensure the timely processing of data that is processed according to the descriptors of the first queue and the second queue. In some implementations, the first queue includes DMA descriptors and the second queue operation descriptors. The operation descriptors may pertain to data that is smaller and in some cases significantly smaller than the data that is linked to the DMA descriptors.

As indicated, in some implementations, the data processed in accordance with descriptors of the first queue may be larger than the data processed in accordance with the descriptors of the second queue. The DMA fragmenter functions to ensure that large data processed in accordance with the descriptors of the first queue does not "starve" the second queue or otherwise cause the second queue to fail to timely process data in accordance with the descriptors therein.

Specifically, the DMA fragmenter is functional to analyze the size of the data being processed in accordance with the descriptors of the first queue. Based on the analysis performed by the DMA fragmenter, the DMA fragmenter may split or divide the data for processing in accordance with the descriptors of the first queue. Specifically, the DMA fragmenter may divide the data linked to the descriptors of the first queue into a plurality of smaller data. This enables the DMA fragmenter to allow processing of data linked to the descriptors of the second queue, in between allowing processing the divided data that was derived from larger data. Accordingly, by splitting or dividing the data linked to the descriptors of the first queue, the DMA fragmenter is able to ensure that the second queue is not starved of time to process data linked to the descriptors thereof.

In general, the DMA engine may be responsible to enable and control DMA data flow within a computing system. In some implementations, the DMA engine moves blocks of data, in accordance with descriptors of a plurality of queues, from a source memory address to a destination memory address, autonomously from control by a computer system's processor. Based on analysis of the descriptors stored in the queues, the DMA engine and its associated DMA data arbiter and DMA fragmenter ensure that data blocks linked to descriptors in the queues do not remain idle for an exorbitant period of time. Specifically, as described, the DMA fragmenter may divide large data blocks into smaller data blocks to ensure that the processing of large data blocks does not preclude the timely processing of smaller data blocks identified by descriptors of one or more of the queues. In some implementations, the data blocks identified by the descriptors in the queues are two-dimensional data blocks. Such two-dimensional data blocks may have an X dimension in bytes and a Y dimension in bytes. In other implementations, the data blocks identified by the descriptors in the queues are three-dimensional data blocks. In general, the implementations described herein may operate on data blocks having any dimension type. In some implementations, the Y dimension is identified as a row value, where each row in the Y dimension comprises a plurality of bytes.

The techniques presented herein provide advantageous computer architecture and data management schemes that can improve the use of local memory and transfer efficiency, which result in a net benefit in terms of processing speed and power consumption.

It should be appreciated that, although described in relation to a system, the above-described subject matter may also be implemented as a computer-controlled apparatus, a computer process, a computing system, or as an article of manufacture such as a computer-readable medium and/or dedicated chipset. These and various other features will be apparent from a reading of the following Detailed Description and a review of the associated drawings. This Summary is provided to introduce a selection of concepts in a simplified form that are further described below in the Detailed Description.

This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DRAWINGS

The Detailed Description is described with reference to the accompanying figures. In the figures, the left-most digit(s) of a reference number identifies the figure in which the reference number first appears. The same reference numbers in different figures indicate similar or identical items. References made to individual items of a plurality of items can use a reference number with a letter of a sequence of letters to refer to each individual item. Generic references to the items may use the specific reference number without the sequence of letters.

DETAILED DESCRIPTION

Figure 1:
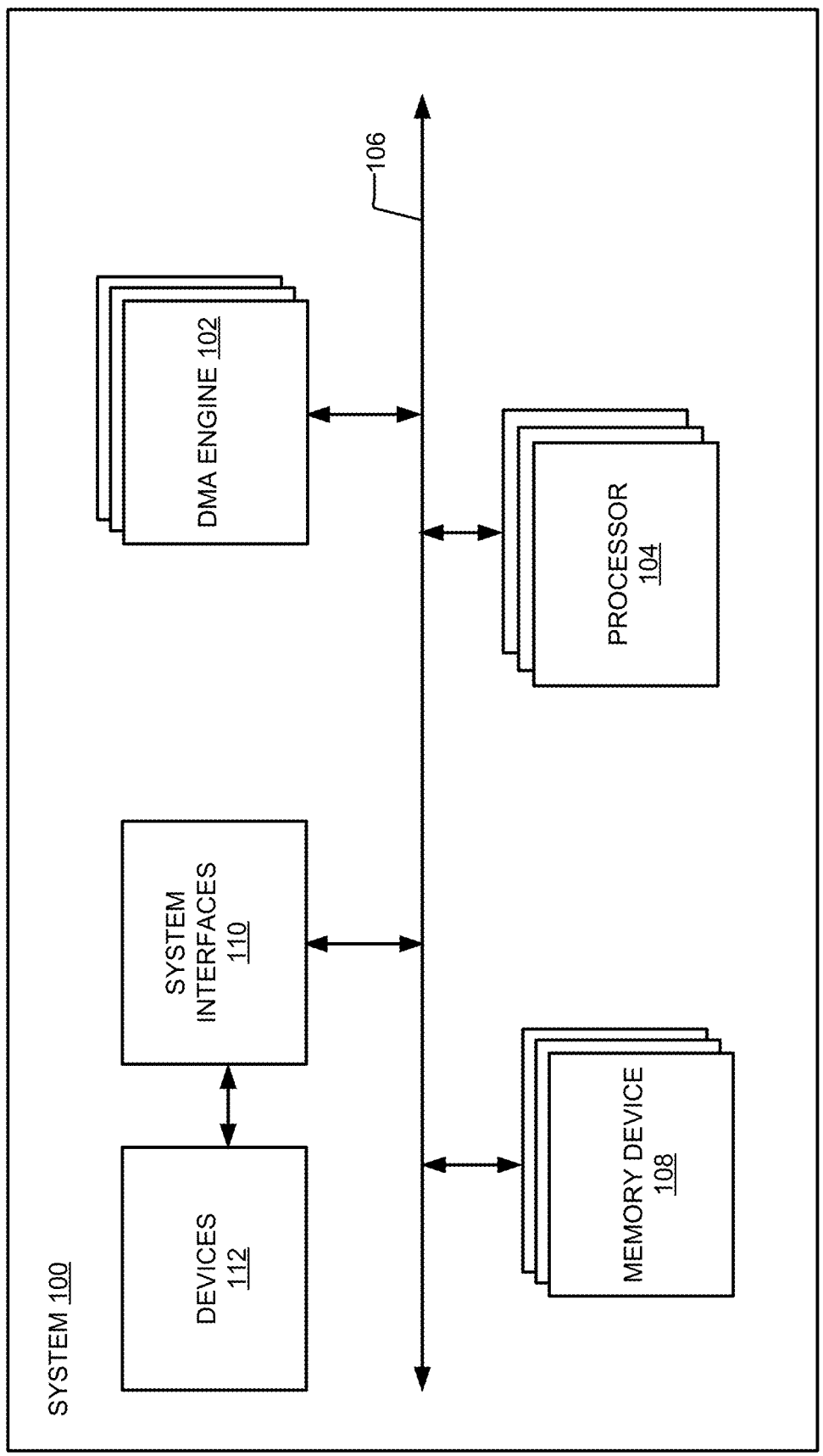
FIG. 1 illustrates an exemplary system in which a direct memory access (DMA) engine interoperates with one or more processors through a fabric, such as an interconnect.

Techniques described herein provide for efficient arbitration of direct memory access (DMA) queues. In some implementations, a computing device or computing system may implement a plurality of queues. Each of the plurality of queues may include instructions, such as descriptors, for processing data. In some implementations, a first of the plurality of queues relates to and includes instructions for processing data that is larger than data that is to be processed in accordance with instructions in a second of the plurality of queues.

The techniques described herein may implement a DMA engine that interfaces with the DMA queues. The DMA engine may employ a DMA data arbiter and a DMA fragmenter. The DMA data arbiter may be functional to regulate data that is processed in accordance with instructions in the first queue and the second queue. Furthermore, the DMA data arbiter may be functional to regulate data that is processed in accordance with instructions of other queues of the plurality of queues. The data instructions included in the plurality of queues may be referred to as descriptors.

The DMA data arbiter may be responsible to ensure the timely processing of data that is processed according to the descriptors of the first queue and the second queue. In some implementations, the first queue includes DMA descriptors and the second queue operation descriptors. The operation descriptors may pertain to data that is smaller and in some cases significantly smaller than the data that is linked to the DMA descriptors.

As indicated, in some implementations, the data processed in accordance with descriptors of the first queue may be larger than the data processed in accordance with the descriptors of the second queue. The DMA fragmenter functions to ensure that large data processed in accordance with the descriptors of the first queue does not "starve" the second queue or otherwise cause the second queue to fail to timely process data in accordance with the descriptors therein.

Specifically, the DMA fragmenter is functional to analyze the size of the data being processed in accordance with the descriptors of the first queue. Based on the analysis performed by the DMA fragmenter, the DMA fragmenter may split or divide the data for processing in accordance with the descriptors of the first queue. Specifically, the DMA fragmenter may divide the data linked to the descriptors of the first queue into a plurality of smaller data. This enables the DMA fragmenter to allow processing of data linked to the descriptors of the second queue, in between allowing processing the divided data that was derived from larger data. Accordingly, by splitting or dividing the data linked to the descriptors of the first queue, the DMA fragmenter is able to ensure that the second queue is not starved of time to process data linked to the descriptors thereof.

In general, the DMA engine may be responsible to enable and control DMA data flow within a computing system. In some implementations, the DMA engine moves blocks of data, in accordance with descriptors of a plurality of queues, from a source memory address to a destination memory address, autonomously from control by a computer system's processor. Based on analysis of the descriptors stored in the queues, the DMA engine and its associated DMA data arbiter and DMA fragmenter ensure that data blocks linked to descriptors in the queues do not remain idle for an exorbitant period of time. Specifically, as described, the DMA fragmenter may divide large data blocks into smaller data blocks to ensure that the processing of large data blocks does not preclude the timely processing of smaller data blocks identified by descriptors of one or more of the queues. In some implementations, the data blocks identified by the descriptors in the queues are two-dimensional data blocks. Such two-dimensional data blocks may have an X dimension in bytes and a Y dimension in bytes. In other implementations, the data blocks identified by the descriptors in the queues are three-dimensional data blocks. In general, the implementations described herein may operate on data blocks having any dimension type. In some implementations, the Y dimension is identified as a row value, where each row in the Y dimension comprises a plurality of bytes.

In some implementations, the DMA engine and its associated DMA data arbiter and DMA fragmenter manage a plurality of queues. The DMA engine and its associated DMA data arbiter and DMA fragmenter may comprise at least one processor; and at least one memory in communication with the at least one processor, the at least one memory having computer readable instructions stored thereupon that, when executed by the at least one processor, cause the at least one processor to: determine a data block is ready for transfer based on a descriptor in a first queue; analyze the descriptor in the first queue to determine at least one property associated with a dimension of the data block; and compare the at least one property associated with the dimension of the data block to a data threshold. When the at least one property associated with the dimension of the data block is greater than the data threshold, fragment the data block to generate at least a plurality of fragmented data blocks from the data block and send at least one of the plurality of fragmented data blocks to a destination memory location, and when the at least one property associated with the dimension of the data block is less than the data threshold, send the data block to the destination memory location unfragmented.

In some implementations, the DMA engine and its associated DMA data arbiter and DMA fragmenter manage a plurality of queues. The DMA engine and its associated DMA data arbiter and DMA fragmenter may comprise at least one processor; and at least one memory in communication with the at least one processor, the at least one memory having computer readable instructions stored thereupon that, when executed by the at least one processor, cause the at least one processor to: determine a data block is ready for transfer based on a descriptor in a first queue; analyze the descriptor in the first queue to determine at least one property associated with a dimension of the data block; and compare the at least one property associated with the dimension of the data block to a dynamically determined or dynamically calculated data threshold. When the at least one property associated with the dimension of the data block is greater than the data threshold, fragment the data block to generate at least a plurality of fragmented data blocks from the data block and send at least one of the plurality of fragmented data blocks to a destination memory location, and when the at least one property associated with the dimension of the data block is less than the data threshold, send the data block to the destination memory location unfragmented.

Furthermore, in some implementations, the DMA engine and its associated DMA data arbiter and DMA fragmenter may comprise at least one processor; and at least one memory in communication with the at least one processor, the at least one memory having computer-readable instructions stored thereupon that, when executed by the at least one processor, cause the at least one processor to: determine a data block is ready for transfer based on a descriptor in a first queue; determine a duration to transfer the data block to a destination memory location; and compare the duration to transfer the data block to the destination memory location to a transfer duration threshold: when the duration to transfer the data block to a destination memory location is greater than or equal to the transfer duration threshold, fragment the data block to generate at least a plurality of fragmented data blocks from the data block and send at least one of the plurality of fragmented data blocks to the destination memory location, and when the duration to transfer the data block to a destination memory location is less than the transfer duration threshold, send the data block to the destination memory location unfragmented.

In some implementations, the DMA engine, DMA fragmenter, DMA data arbiter and the plurality of queues are associated with a neural network (NN) and/or Deep Neural Network (DNN) environment. An exemplary DNN environment can comprise one or more processors (e.g., computer processing units—CPUs), a memory controller, a high bandwidth fabric (e.g., data bus passing data and/or data elements between an exemplary DNN module and the cooperating components of a DNN environment), iterator controller, operation controller, and a DNN module. In the illustrative implementation, the exemplary DNN module can comprise an exemplary DNN state controller, a descriptor list controller (DLC), dMA (DDMA), DMA Streaming Activations (DSA), operation controller, load controller, and store controller.

In artificial neural networks, a neuron is the base unit used to model a biological neuron in the brain. The model of an artificial neuron can include the inner product of an input vector with a weight vector added to a bias, with a non-linearity applied. Comparatively, a neuron, in an exemplary DNN module, is closely mapped to an artificial neuron.

Illustratively, the DNN module can be considered a superscalar processor. Operatively, it can dispatch one or more instructions to multiple execution units called neurons. The execution units can be "simultaneous dispatch simultaneous complete" where each execution unit is synchronized with all of the others. A DNN module can be classified as a SIMD (single instruction stream, multiple data stream) architecture.

FIG. 1 illustrates an exemplary system 100 in which a DMA engine 102 interoperates with one or more processors 104 through a fabric 106, such as an interconnect. In some embodiments, there may be multiple DMA engines 102. The fabric 106 generally operates at a chip level, but may include interconnects among processors, caches, memory, peripheral components (e.g., PCIe—Peripheral Component Interconnect Express), or the like, and may be implemented within a single chip in some cases, or may support connectivity among multiple chips in others. The fabric 106 is not limited to a specific protocol or topology, and may include, by way of example and without any limitation, a bus, point-to-point, circuit-switched, crossbar, packet-based, or network-on-a-chip arrangements, or combinations thereof.

The system 100 is typically implemented in hardware using various integrated circuits in system-on-chip (SoC) or embedded system architectures. For example, the system 100 (including the DMA engine 100 and its associated constituent components) may be implemented using one or more field programmable gate arrays (FPGAs) having configurable logic blocks (CLBs) that are arranged to enable the system 100 to perform its as-designed functions. Each CLB typically includes a configurable input switching matrix, selection circuitry such as a multiplexer (mux), and flip-flop (i.e., latch) circuits. The fabric 106 may also support connectivity to various memory devices 108 and system interfaces 110. The system interfaces 110 may couple devices 112 to the fabric 106. Therefore, the fabric 106, via the system interfaces 110 in some implementations, couples the devices 112 to devices and elements associated with the system 100.

In some implementations, the DMA engine 102 services and manages the memory or data requirements of the devices 112. Each of the devices 112 may be a hardware device or a software module or combination thereof. Moreover, each of the devices 112 may include memory and/or storage. As indicated, the devices 112 interface with the DMA engine 102 through the fabric 106 and the system interfaces 110. The system interfaces 110 and the fabric 106 allow the DMA engine 102 to service the data requirements of the devices 112, while providing sufficient response time and bandwidth for the devices 112. In some implementations, the DMA engine 102 provides for servicing and managing the memory or data requirements of the devices 112, without the need to utilize the processor 104. Specifically, the DMA engine 102 may accept data requests, either a read or write operation associated with the memory devices 108, from the devices 112 and memory associated therewith. Such data requests may apply to the interaction between the DMA engine 102 and the devices 112 or to the interaction between the DMA engine 102 and the memory devices 108. In some implementations, the memory devices 108 include main memory, other memory, and/or storage associated with the system 100, internal or external storage devices associated with the system 100, and so forth.

In some nonlimiting implementations, the system 100 is a NN or DNN. Therefore, in some implementations, at least the DMA engine 102 is arranged in the NN or DNN.

Figure 2:
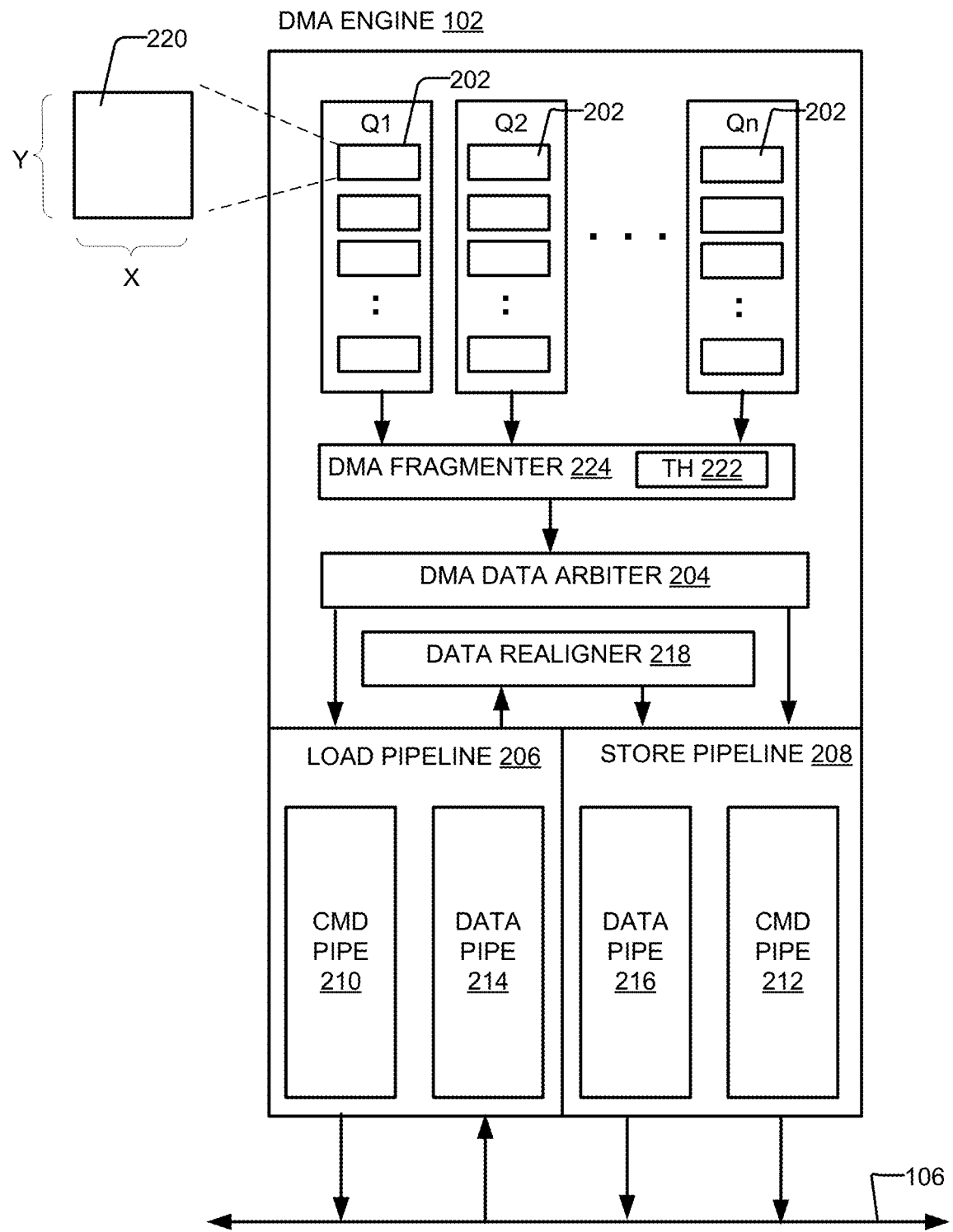
FIG. 2 illustrates an exemplary block diagram of a DMA engine.

FIG. 2 illustrates a block diagram of the DMA engine 102. The DMA engine 102 moves blocks of data from a source memory to a destination memory, such as from a source memory address to a destination memory address, autonomously from control by the processor 104. For example, the DMA engine 102 may move blocks of data from a first of the memory devices 108 to a second of the memory devices 108. In another implementation, the DMA engine 102 may interface with a device 112 to facilitate moving one or more data blocks to and from the memory devices 108.

A given data transfer may be configured using a descriptor (s) 202 that generally includes the source memory address, destination memory address, control parameters, and other information in some cases, for a data block for transfer. In some implementations, each of the descriptors 202 includes the parameters X dimension and Y dimension for a data block for transfer. Furthermore, stride control parameters may be included with the descriptors 202. In some implementations, the X dimension and Y dimension parameters are byte values. Specifically, the X dimension parameter defines the number of bytes in the X dimension and the Y dimension parameter defines the number of bytes in the Y dimension of a data block. The size of the data block and the total payload of the data block may be calculated by multiplying the X dimension parameter by the Y dimension parameter. In some implementations, the Y dimension parameter is a row value. The row value may define the number of rows in a data block for transfer. Each of the one or more rows in the data block for transfer may comprise one or more bytes.

In some implementations, the descriptors 202 may identify two-dimensional data blocks that are to be moved from a source memory location to a destination memory location. FIG. 2 illustrates an exemplary two-dimensional data block 220, which may be moved from a source memory location to a destination memory location via the fabric 106 and the elements of DMA engine 102.

The descriptors 202 may be stored in a plurality of queues Q1-Qn. In some implementations, the descriptors 202 stored in the queue Q1 are DMA data descriptors that identify DMA data blocks that may vary in size. For example, a first of the descriptors 202 may identify the dimensions 64B×64B (X dimension×Y dimension) associated with a two-dimensional data block, which translates to 4 kB. Descriptors 202 identifying differently sized data blocks may also be in the queue Q1. In some implementations, the descriptors 200 may identify the dimensions 64B×64 rows (X dimension×Y dimension) associated with a two-dimensional data block, which also translates to 4 kB.

The descriptors 202 stored in the queue Q2 may be operation descriptors. Such operation descriptors may identify data blocks that are smaller or considerably smaller than the data blocks identified or linked to the descriptors 202 stored in the queue Q1. In some implementations, one or more of the descriptors 202 stored in the queue Q2 may be identified as a 128B×1B two-dimensional data block, which translates to 128B. In some implementations, the queues Q1-Qn are first in first out (FIFO) queues. Furthermore, in some implementations, the DMA engine 102 processes the descriptors 202 as they leave their respective queues Q1-Qn and are under the control of a DMA data arbiter 204. Furthermore, a DMA fragmenter 224 may be employed by the DMA engine 102. The function of the DMA data arbiter 204 and the DMA fragmenter 224 are described in additional detail in the following.

Under control of the DMA data arbiter 204, data blocks identified by the descriptors 202 may be passed to load and store pipelines 206 and 208 respectively, which include respectively command pipe 210 and 212 and data pipes 214 and 216. Furthermore, the DMA engine 102 can perform data realignment through the data pipes to allow reads and writes that are independent of byte offset on a page of memory.

The DMA fragmenter 224 may comprise at least one threshold value 222. In some implementations, the DMA fragmenter 224 may comprise a plurality of threshold values 222. A primary function of the DMA fragmenter 224 is to ensure that the processing of descriptors 202 associated with a single queue (e.g., queue Q1) does not delay or stymie the processing of descriptors 202 in other queues (e.g., queues Q2-Qn). Use of the at least one threshold value 222 helps to ensure that a single queue or a plurality of queues in the DMA engine 102 do not dominate other queues in the DMA engine 102.

In some implementations, the at least one threshold value 222 is a data threshold, such as a byte value threshold. The DMA fragmenter 224 may use the byte value threshold to determine if a data block 220 associated with a descriptor 202 from one of the queues Q1-Qn is to be fragmented into a plurality of data blocks. If the DMA fragmenter 224 fragments, for example, the data block 220 associated with a descriptor 202 for the queue Q1, a plurality of fragmented data blocks will be provided. This allows the DMA data arbiter 204 to process data blocks 220 associated with descriptors 202 from another queue, such as the queue Q2, in between each of the fragmented data blocks derived from the unfragmented data block associated with the descriptor 202 from the queue Q1. In some implementations, the DMA fragmenter 224 may cause the generation of fragmented data blocks associated with a plurality of the queues Q1-Qn. For example, the DMA fragmenter 224 may cause the generation of fragmented data blocks associated with Q1 and the generation of fragmented data blocks associated with Q2, and so forth. The DMA fragmenter 224 may arbitrate when the fragmented data blocks associated with the plurality of queues Q1-Qn are sent to the destination memory.

Figure 3:
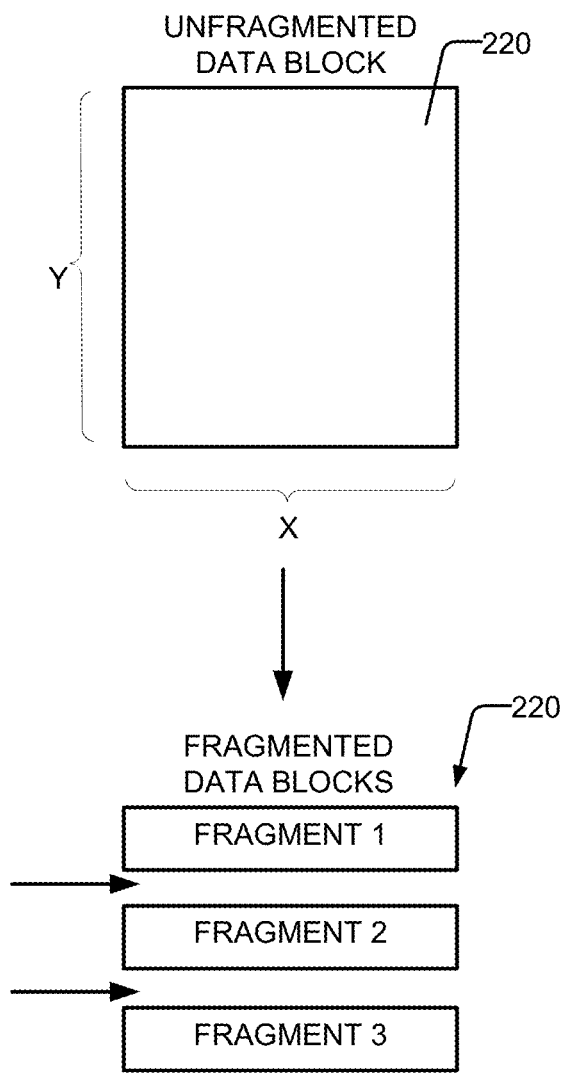
FIG. 3 illustrates an exemplary two-dimensional data block prior to being fragmented by the DMA engine and subsequent to a fragment process initiated by the DMA engine, based on at least one threshold value.

FIG. 3 illustrates the exemplary two-dimensional data block 220 prior to being fragmented by the DMA fragmenter 224 and subsequent to a fragment process initiated by the DMA fragmenter 224, based on the at least one threshold value 222 (FIG. 2). In one exemplary implementation, the at least one threshold value 222 is used by the DMA fragmenter 224 to divide the exemplary two-dimensional data block 220 into fragmented data blocks (e.g., fragments 1-3). This enables the DMA fragmenter 224 to insert data blocks associated with one or more descriptors 202 from one or more of the queues Q2-Qn between fragment 1 and fragment 2, and between fragment 2 and fragment 3. Therefore, the process of fragmenting data blocks, in some implementations large data blocks from queue Q1, advantageously prevents one or more descriptors 202 associated with the queue Q1 from dominating or starving queues Q2-Qn.

In some implementations, the DMA fragmenter 224 will fragment data blocks based on one or more of the following conditions: where the X and Y dimensions are provided in a descriptor 202 being processed by the DMA fragmenter 224, and where the data block payload size may be obtained from calculating the product of the X and Y dimensions of the data block 220 linked to the descriptor 202:
1. (Y dimension=1 row of bytes) AND (the threshold value 222 (in bytes) <X dimension));
2. (Y dimension >1 row of bytes) AND (the threshold value 222 (in bytes) <data block payload (in bytes)) AND (the X dimension ≤threshold value 222 (in bytes)).

Furthermore, in some implementations, the X dimension is equal to X dimension identified in a descriptor 202 prior to being processed by the DMA fragmenter 224, assuming the condition of the Y dimension being greater than one. Furthermore, in some implementations, and X dimension of one or more fragmented blocks will be equal to the threshold value 222 when the Y dimension is equal to one. However, a last fragmented block in a series of fragmented blocks may have an X dimension that is less than the threshold value 222. In addition, in some implementations, when the Y dimension identified in a descriptor 202 prior to being processed by the DMA fragmenter 224 is equal to one, then fragmented blocks of generated by the DMA fragmenter 224 will each have a Y dimension equal to one.

In some implementations, fragmentation may disabled. For example, the one or more DMA engines 102 may be configured to no longer fragment data blocks associated with the descriptors 202. The fragmentation may be disabled in hardware and/or software.

In some implementations, fragmentation may be disabled based on the following provided conditions. For example, the DMA fragmenter 224 may be configured to disable fragmentation based on one or more of the following conditions: where the X and Y dimensions are provided in a descriptor 202 being processed by the DMA engine 102, and where the data block payload size may be obtained from calculating the product of the X and Y dimensions of the data block 220 linked to the descriptor 202:
1. (Y dimension >1 row of bytes) AND (the threshold value 222 (in bytes) <X dimension));
2. Threshold value 222>the data block payload size;
3. (Y dimension=1 row of bytes) AND (the X dimension <threshold value 222 (in bytes)).

In some implementations, the at least one threshold value 222 is dynamically determined based on one or more transfer functions that receives one or more inputs. The one or more inputs may be associated with one or more functionalities of the system 100. For example, the transfer function may receive one or more bandwidth allocation values associated with the fabric 106, one or more contention values associated with fabric 106, one or more quality of service values related to the system 100, one or more duration values in time that may be associated with one or more queues, and/or one or more fabric bandwidth capacity values associated with the fabric 106. In some implementations, the at least one threshold value 222 uses one or more of the indicated exemplary inputs to dynamically calculate or determine the at least one threshold value 222.

The one or more transfer functions may be implemented by the DMA fragmenter 224. Furthermore, the DMA fragmenter 224 may receive the one or more indicated exemplary inputs to dynamically calculate or determine the at least one threshold value 222. The one or more indicated exemplary inputs may be provided by one or more sensors associated with the system 100 and/or the DMA engine 102. For example, the system 100 and/or the DMA engine 100 to may implement one or more sensors to monitor a current bandwidth and contention associated with the fabric 106.

In some implementations, the at least one threshold value 222 is a transfer duration threshold, or the transfer duration threshold is in addition to the data threshold described in the foregoing. The transfer duration threshold may be expressed as a time value, such as in milliseconds or the like. The DMA fragmenter 224 may use the transfer duration threshold to determine if a data block 220 associated with a descriptor 202 from one of the queues Q1-Qn is to be fragmented into a plurality of data blocks. Specifically, the DMA fragmenter 224 may estimate or calculate the duration of time that will be required to transfer the data block 220 associated with the descriptor 202 from a source memory location to a destination memory location. That is, the DMA fragmenter 224 may calculate a payload size of the data block 220 associated with the descriptor 202 to determine a duration needed to transfer the data block from the source memory location to the destination memory location. The DMA fragmenter 224 may calculate or estimate the duration needed to transfer the data block based on the technology particulars of the system 100 (e.g., the type of fabric 106, system interfaces 110, and/or memory devices 106). The DMA fragmenter 224 may fragment the data block 220, similar to that illustrated in FIG. 3, when the estimated or calculated duration to transfer the data block 220 exceeds the transfer duration threshold.

The following are a number of example DMA data transfer scenarios provided in accordance with the two conditions provided in the foregoing. In some implementations, a data block 220 may have an X dimension in bytes, and the data threshold 222 is a byte value threshold. When the X dimension in bytes is less than or equal to the byte value threshold 222, the DMA engine 102 fragments the data block to generate at least the plurality of fragmented data blocks (e.g., fragments 1-3) from the data block 220 and sends the at least one of the plurality of fragmented data blocks to a destination memory location. In some implementations, the DMA engine 102 fragments the data block to generate at least the plurality of fragmented data blocks from the data block 220, and the DMA engine 102 sends all of the plurality of fragmented data blocks generated from the data block 222 one or more destination memory locations. Furthermore, in some implementations, a byte value sum of the plurality of fragmented data blocks does not exceed the byte value threshold 222.

Furthermore, in some implementations, the data block 220 has a Y dimension in bytes, either expressed as a byte value or a row value. When the X dimension in bytes is less than or equal to the byte value threshold 222, the data block 220 in the Y dimension is fragmented to generate the plurality of fragmented data blocks (e.g., fragments 1-3), each of the plurality of fragmented data blocks having a Y dimension that is smaller than the Y dimension of the data block 220.

In some implementations, the data block 220 has a Y dimension in bytes, either expressed as a byte value or in row value. When the X dimension in bytes is less than or equal to the byte value threshold 222 and the Y dimension is greater than one row, the data block 220 in the Y dimension is fragmented to generate the plurality of fragmented data blocks (e.g., fragments 1-3), each of the plurality of fragmented data blocks having a Y dimension that is smaller than the Y dimension of the data block 220.

In some implementations, the data block 220 has a Y dimension in bytes, either expressed as a byte value or row value. When the Y dimension is greater than one row, the data block 220 is fragmented to generate at least the plurality of fragmented data blocks (e.g., fragments 1-3) from the data block 220 and sends the at least one of the plurality of fragmented data blocks to the destination memory location.

In some implementations, the data block 220 has an X dimension in bytes and a Y dimension in bytes, either expressed as a byte value or row value. The data threshold is a byte value threshold 222. When the Y dimension is equal to one row and the X dimension in bytes is greater than the byte value threshold 222, the data block in the X dimension is fragmented to generate the plurality of fragmented data blocks, each of the plurality of fragmented data blocks having an X dimension in bytes that is smaller than the X dimension in bytes of the data block.

Figure 4:
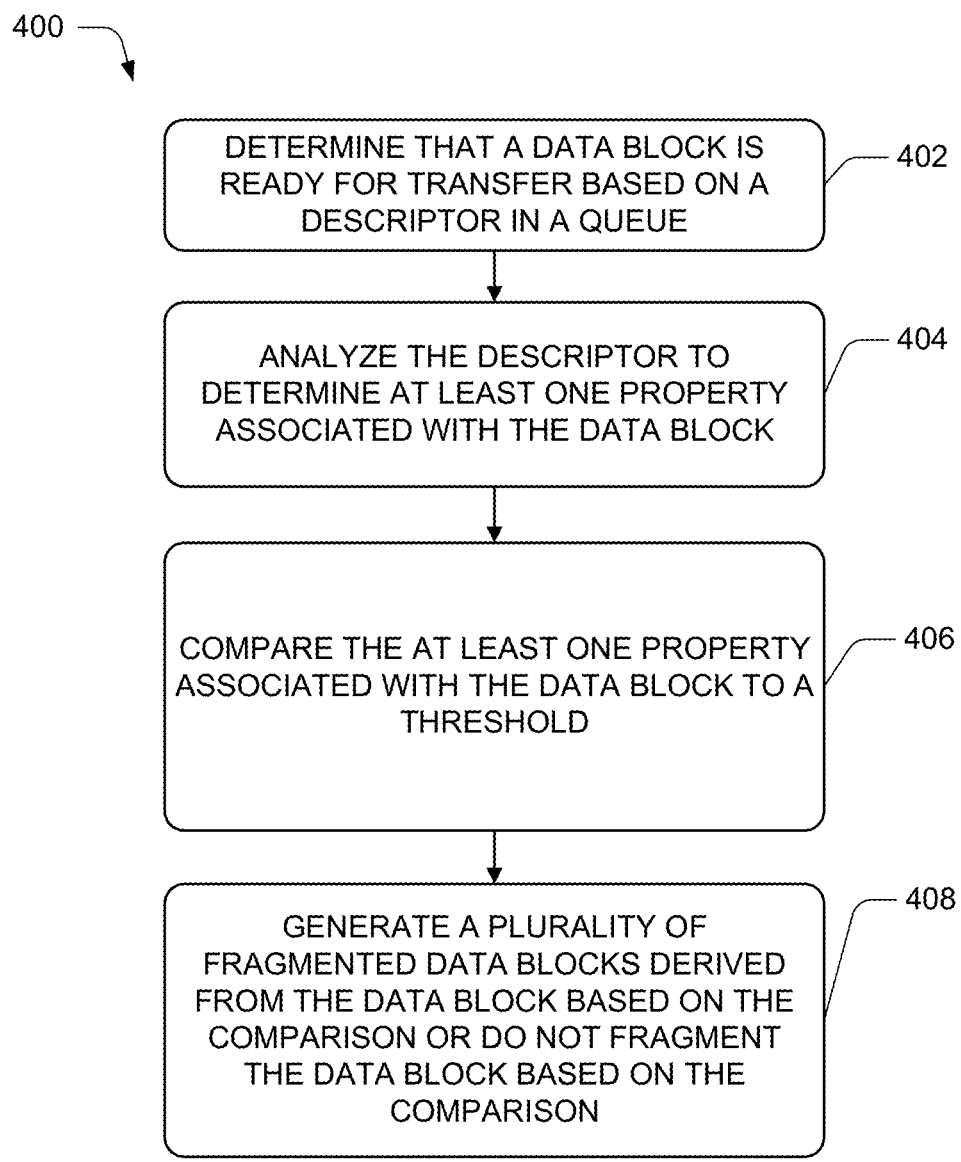
FIG. 4 illustrates exemplary aspects of a routine for processing data blocks associated with descriptors as are shown and described.

Turning now to FIG. 4, aspects of a routine 400 for processing data blocks associated with descriptors are shown and described. It should be understood that the operations of the methods disclosed herein are not necessarily presented in any particular order and that performance of some or all of the operations in an alternative order(s) is possible and is contemplated. The operations have been presented in the demonstrated order for ease of description and illustration. Operations may be added, omitted, and/or performed simultaneously, without departing from the scope of the appended claims. Furthermore, it is to be understood that the routine 400 may be implemented by one or more of the elements associated with the system 100.

It also should be understood that the illustrated methods can end at any time and need not be performed in their entireties. Some or all operations of the methods, and/or substantially equivalent operations, can be performed by execution of computer-readable instructions included on a computer-storage media, as defined below. The term "computer-readable instructions," and variants thereof, as used in the description and claims, is used expansively herein to include routines, applications, application modules, program modules, programs, components, data structures, algorithms, and the like. Computer-readable instructions can be implemented on various system configurations, including single-processor or multiprocessor systems, minicomputers, mainframe computers, personal computers, hand-held computing devices, microprocessor-based, programmable consumer electronics, combinations thereof, and the like.

It should be appreciated that the logical operations described herein are implemented (1) as a sequence of computer implemented acts or program modules running on a computing system and/or (2) as interconnected machine logic circuits or circuit modules within the computing system. The implementation is a matter of choice dependent on the performance and other requirements of the computing system. Accordingly, the logical operations described herein are referred to variously as states, operations, structural devices, acts, or modules. These operations, structural devices, acts, and modules may be implemented in software, in firmware, in special purpose digital logic, and any combination thereof.

For example, the operations of the routine 400 are described herein as being implemented, at least in part, by an application, component and/or circuit, such as the DMA engine 102 in FIGS. 1 and 2 and associated with the system 100. Additionally, although the following illustration may refer to the components or elements of FIGS. 1-3, it can be appreciated that the operations of the routine 400 may also be implemented in many other ways. In addition, one or more of the operations of the routine 400 may alternatively or additionally be implemented, at least in part, by a chipset working alone or in conjunction with other software modules. Any service, circuit or application suitable for providing the techniques disclosed herein can be used in operations described herein.

At block 402, the DMA engine 102 and/or the DMA fragmenter 224 determines that a data block 220 is ready for transfer based on a descriptor 202 in a queue, such as one of the queues Q1-Qn. At block 404, the DMA engine 102 and/or the DMA fragmenter 224 analyzes the descriptor 202 to determine at least one property associated with the data block 220. The at least one property associated with the data block 220 may be associated with a data dimension of the data block 220. For example, the at least one property associated with the data block 220 may be a byte value associated with a dimension of the data block 220. Alternatively, the at least one property associated with the data block 220 may be a calculated or estimated duration to transfer the data block 220 from a source memory location to a destination memory location. The source memory location and the destination memory location may be associated with a main memory or other memory/storage of the system 100. Alternatively, the source memory location may be associated with a first system and the destination memory location may be associated with a second system.

At block 406, the DMA engine 102 and/or the DMA fragmenter 224 compares the at least one property associated with the data block 220 to a threshold 222. In some implementations, the threshold 222 is a data threshold. The data threshold may be expressed in bytes. Alternatively, or in addition, in some implementations, the threshold 222 is a transfer duration threshold.

At block 408, based on the comparison performed at block 406, a plurality of fragmented blocks derived from the data block 220 may be generated by the DMA fragmenter 224. At least one of the derived fragmented blocks may be transferred or sent to a destination memory location from a source memory location. Alternatively, based on the comparison performed at block 406, the data block 220 is not fragmented and is sent or transferred unfragmented to a destination memory location from a source memory location.

Figure 5:
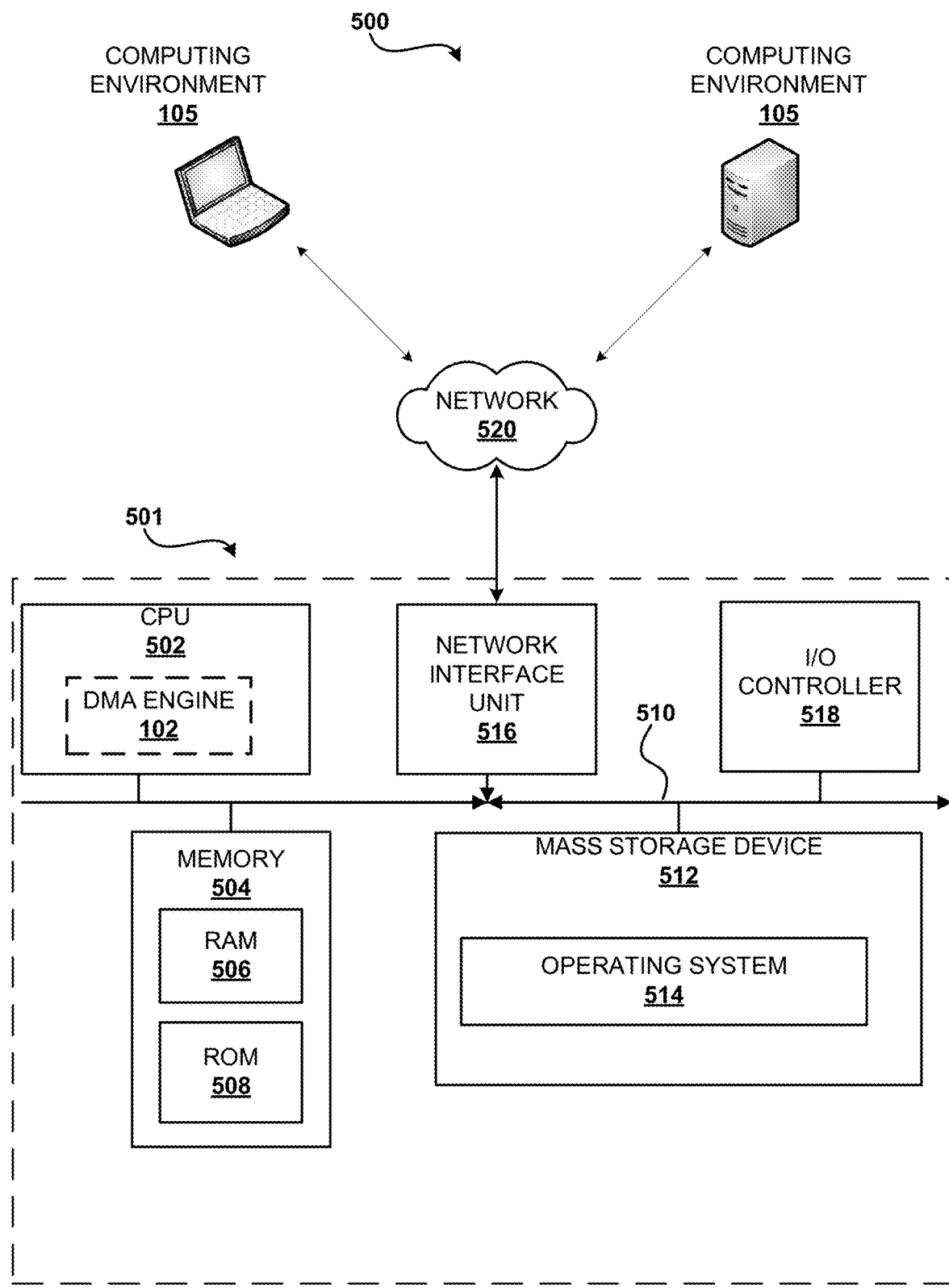
FIG. 5 shows additional details of an illustrative computer architecture for a computer capable of executing the herein described methods.

The computer architecture 500 illustrated in FIG. 5 includes a central processing unit 502 (processor or CPU), a system memory 504, including a random-access memory 506 (RAM) and a read-only memory (ROM) 508, and a system bus 510 that couples the memory 504 to the CPU 502. A basic input/output system containing the basic routines that help to transfer information between elements within the computer architecture 500, such as during startup, is stored in the ROM 508. The computer architecture 500 further includes a mass storage device 512 for storing an operating system 514, other data, and one or more application programs.

The mass storage device 512 is connected to the CPU 502 through a mass storage controller (not shown) connected to the bus 510. The mass storage device 512 and its associated computer-readable media provide non-volatile storage for the computer architecture 500. Although the description of computer-readable media contained herein refers to a mass storage device, such as a solid-state drive, a hard disk or CD-ROM drive, it should be appreciated by those skilled in the art that computer-readable media can be any available computer storage media or communication media that can be accessed by the computer architecture 500.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

By way of example, and not limitation, computer storage media may include volatile and non-volatile, removable and non-removable media implemented in any method or technology for storage of information such as computer-readable instructions, data structures, program modules or other data. For example, computer media includes, but is not limited to, RAM, ROM, EPROM, EEPROM, flash memory or other solid-state memory technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer architecture 500. For purposes of the claims, the phrase "computer storage medium," "computer-readable storage medium" and variations thereof, does not include waves, signals, and/or other transitory and/or intangible communication media, per se.

According to various techniques, the computer architecture 500 may operate in a networked environment using logical connections to remote computers or computing environment(s) 105 through a network 520 and/or another network (not shown). The computer architecture 500 may connect to the network 520 through a network interface unit 516 connected to the bus 510. It should be appreciated that the network interface unit 516 also may be utilized to connect to other types of networks and remote computer systems. The computer architecture 500 also may include an input/output controller 518 for receiving and processing input from a number of other devices, including a keyboard, mouse, or electronic stylus (not shown in FIG. 5). Similarly, the input/output controller 518 may provide output to a display screen, a printer, or other type of output device (also not shown in FIG. 5). It should also be appreciated that via a connection to the network 520 through a network interface unit 516, the computing architecture may enable DMA engine 102 to communicate with the computing environments 501.

It should be appreciated that the software components described herein may, when loaded into the CPU 502 and/or the DMA engine 102 and executed, transform the CPU 502 and/or the DMA engine 102 and the overall computer architecture 500 from a general-purpose computing system into a special-purpose computing system customized to facilitate the functionality presented herein. The CPU 502 and/or the DMA engine 102 may be constructed from any number of transistors or other discrete circuit elements and/or chipset, which may individually or collectively assume any number of states. More specifically, the CPU 502 and/or the DMA engine 102 may operate as a finite-state machine, in response to executable instructions contained within the software modules disclosed herein. These computer-executable instructions may transform the CPU 502 by specifying how the CPU 502 transitions between states, thereby transforming the transistors or other discrete hardware elements constituting the CPU 502.

Encoding the software modules presented herein also may transform the physical structure of the computer-readable media presented herein. The specific transformation of physical structure may depend on various factors, in different implementations of this description. Examples of such factors may include, but are not limited to, the technology used to implement the computer-readable media, whether the computer-readable media is characterized as primary or secondary storage, and the like. For example, if the computer-readable media is implemented as semiconductor-based memory, the software disclosed herein may be encoded on the computer-readable media by transforming the physical state of the semiconductor memory. For example, the software may transform the state of transistors, capacitors, or other discrete circuit elements constituting the semiconductor memory. The software also may transform the physical state of such components in order to store data thereupon.

As another example, the computer-readable media disclosed herein may be implemented using magnetic or optical technology. In such implementations, the software presented herein may transform the physical state of magnetic or optical media, when the software is encoded therein. These transformations may include altering the magnetic characteristics of particular locations within given magnetic media. These transformations also may include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer architecture 500 in order to store and execute the software components presented herein. It also should be appreciated that the computer architecture 500 may include other types of computing devices, including hand-held computers, embedded computer systems, personal digital assistants, and other types of computing devices known to those skilled in the art. It is also contemplated that the computer architecture 500 may not include all of the components shown in FIG. 5, may include other components that are not explicitly shown in FIG. 5, or may utilize an architecture completely different than that shown in FIG. 5.

Computing system 500, described above, can be deployed as part of a computer network. In general, the above description for computing environments applies to both server computers and client computers deployed in a network environment.

Figure 6:
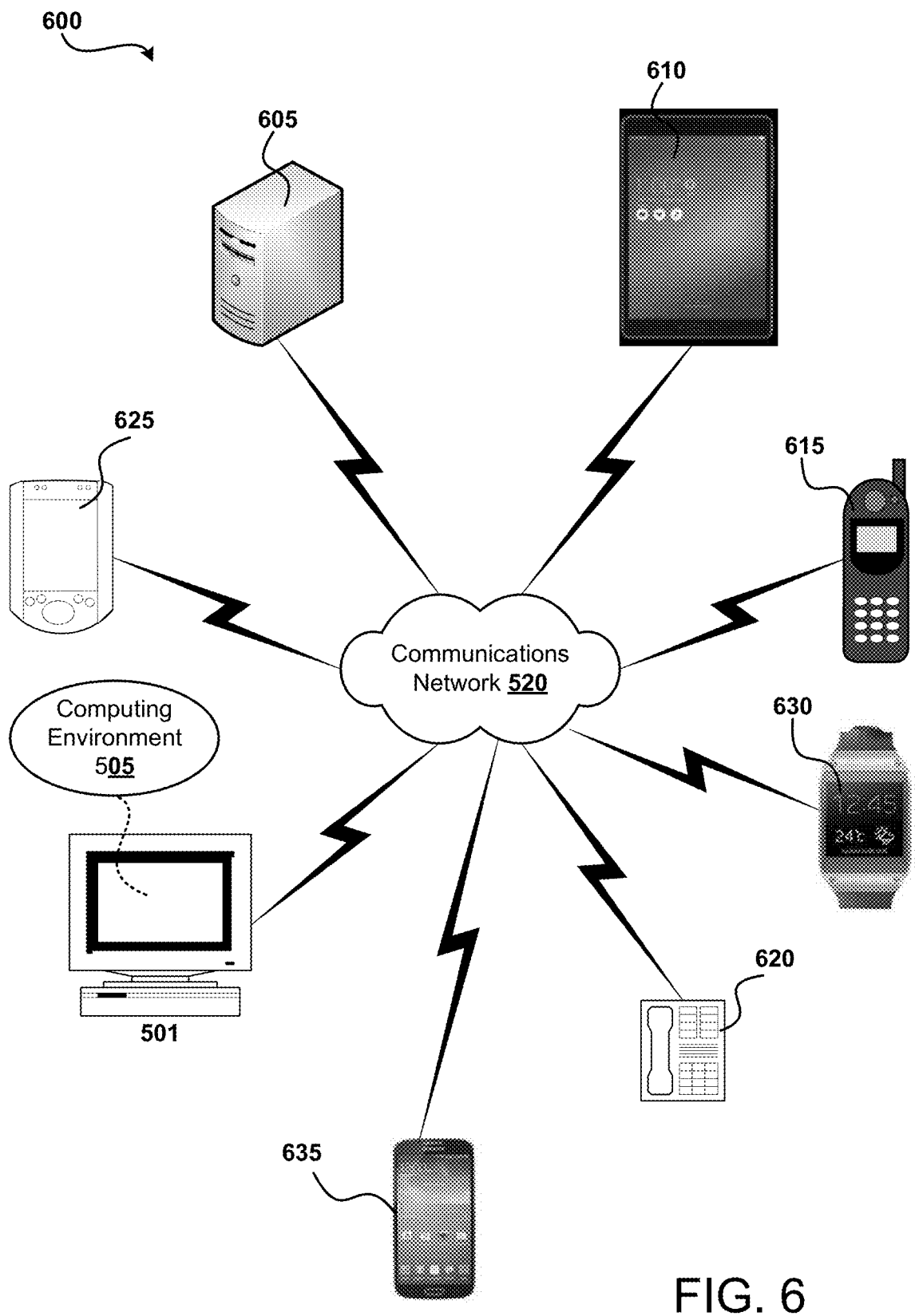
FIG. 6 shows additional details of illustrative computing devices cooperating in accordance with the herein described systems and methods.

FIG. 6 illustrates an exemplary illustrative networked computing environment 600, with a server in communication with client computers via a communications network, in which the herein described apparatus and methods may be employed. As shown in FIG. 6, server(s) 605 may be interconnected via a communications network 520 (which may be either of, or a combination of, a fixed-wire or wireless LAN, WAN, intranet, extranet, peer-to-peer network, virtual private network, the Internet, Bluetooth communications network, proprietary low voltage communications network, or other communications network) with a number of client computing environments such as a tablet personal computer 610, a mobile telephone 615, a telephone 620, a personal computer(s) 501, a personal digital assistant 625, a smart phone watch/personal goal tracker (e.g., Apple Watch, Samsung, FitBit, etc.) 630, and a smart phone 635. In a network environment in which the communications network 520 is the Internet, for example, server(s) 605 can be dedicated computing environment servers operable to process and communicate data to and from client computing environments 501, 610, 615, 620, 625, 630, and 635 via any of a number of known protocols, such as, hypertext transfer protocol (HTTP), file transfer protocol (FTP), simple object access protocol (SOAP), or wireless application protocol (WAP). Additionally, the networked computing environment 600 can utilize various data security protocols such as secured socket layer (SSL) or pretty good privacy (PGP). Each of the client computing environments 501, 510, 515, 520, 525, 530, and 535 can be equipped with computing environment 505 operable to support one or more computing applications or terminal sessions such as a web browser (not shown), or other graphical user interface (not shown), or a mobile desktop environment (not shown) to gain access to the server computing environment(s) 605.

Server(s) 605 may be communicatively coupled to other computing environments (not shown) and receive data regarding the participating user's interactions/resource network. In an illustrative operation, a user (not shown) may interact with a computing application running on a client computing environment(s) to obtain desired data and/or computing applications. The data and/or computing applications may be stored on server computing environment(s) 605 and communicated to cooperating users through client computing environments 601, 610, 615, 620, 625, 630, and 635, over an exemplary communications network 520. A participating user (not shown) may request access to specific data and applications housed in whole or in part on server computing environment(s) 605. These data may be communicated between client computing environments 501, 610, 615, 620, 625, 630, 635 and server computing environment(s) 605 for processing and storage. Server computing environment(s) 605 may host computing applications, processes and applets for the generation, authentication, encryption, and communication of data and applications and may cooperate with other server computing environments (not shown), third party service providers (not shown), network attached storage (NAS) and storage area networks (SAN) to realize application/data transactions.

Example Clauses

The disclosure presented herein may be considered in view of the following clauses.

Example Clause A, a system for managing a plurality of queues, the system comprising: at least one processor; and at least one memory in communication with the at least one processor, the at least one memory having computer readable instructions stored thereupon that, when executed by the at least one processor, cause the at least one processor to: determine a data block is ready for transfer based on a descriptor in a first queue; analyze the descriptor in the first queue to determine at least one property associated with a dimension of the data block; and compare the at least one property associated with the dimension of the data block to a data threshold: when the at least one property associated with the dimension of the data block is greater than the data threshold, fragment the data block to generate at least a plurality of fragmented data blocks from the data block and send at least one of the plurality of fragmented data blocks to a destination memory location, and when the at least one property associated with the dimension of the data block is less than the data threshold, send the data block to the destination memory location unfragmented.

Example Clause B, the system according to Example Clause A, wherein the data block has an X dimension in bytes and the data threshold is a byte value threshold, when the X dimension in bytes is less than or equal to the byte value threshold, fragment the data block to generate at least the plurality of fragmented data blocks from the data block and send the at least one of the plurality of fragmented data blocks to the destination memory location.

Example Clause C, the system according to Example Clause B, wherein the data block has a Y dimension, and when the X dimension in bytes is less than or equal to the byte value threshold, fragment the data block in the Y dimension to generate the plurality of fragmented data blocks, each of the plurality of fragmented data blocks having a Y dimension that is smaller than the Y dimension of the data block.

Example Clause D, the system according to Example Clause B, wherein the data block has a Y dimension, and when the X dimension in bytes is less than or equal to the byte value threshold and the Y dimension is greater than one, fragment the data block in the Y dimension to generate the plurality of fragmented data blocks, each of the plurality of fragmented data blocks having a Y dimension that is smaller than the Y dimension of the data block.

Example Clause E, the system according to Example Clause B, wherein the data block has a Y dimension, and when the Y dimension is greater than one, fragment the data block to generate at least the plurality of fragmented data blocks from the data block and send the at least one of the plurality of fragmented data blocks to the destination memory location.

Example Clause F, the system according Example Clauses A through E, wherein the data block has an X dimension in bytes and a Y dimension, and the data threshold is a byte value threshold, when the Y dimension in bytes is equal to one and the X dimension in bytes is greater than the byte value threshold, fragment the data block in the X dimension to generate the plurality of fragmented data blocks, each of the plurality of fragmented data blocks having an X dimension in bytes that is smaller than the X dimension in bytes of the data block.

Example Clause G, the system according to Example Clauses A Through F, wherein the computer readable instructions, when executed by the at least one processor, cause the at least one processor to determine a data block identified by an operation descriptor in a second queue is ready for transfer, and send the data block identified by the operation descriptor to a memory location after the at least one of the plurality of fragmented data blocks is sent to the destination memory location.

Example Clause H, the system according to Example Clause G, wherein the data block identified by the descriptor in the first queue is identified by a direct memory access (DMA) descriptor.

Example Clause I, the system according to Example Clause G, wherein the data block identified by the descriptor in the first queue is a two-dimensional data block and the data block identified by the operation descriptor in the second queue is at least a two-dimensional data block, and the system is associated with a neural network.

Example Clause J, a system for managing a plurality of queues, the system comprising: at least one processor; and at least one memory in communication with the at least one processor, the at least one memory having computer readable instructions stored thereupon that, when executed by the at least one processor, cause the at least one processor to: determine a data block is ready for transfer based on a descriptor in a first queue; analyze the descriptor in the first queue to determine at least one property associated with a dimension of the data block; and compare the at least one property associated with the dimension of the data block to a data threshold, the data threshold having been dynamically determined: when the at least one property associated with the dimension of the data block is greater than the data threshold, fragment the data block to generate at least a plurality of fragmented data blocks from the data block and send at least one of the plurality of fragmented data blocks to a destination memory location, and when the at least one property associated with the dimension of the data block is less than the data threshold, send the data block to the destination memory location unfragmented.

Example Clause K, the system according to Example Clause J, wherein the computer readable instructions, when executed by the at least one processor, cause the at least one processor to determine a data block identified by an operation descriptor in a second queue is ready for transfer, and send the data block identified by the operation descriptor to a memory location after the at least one of the plurality of fragmented data blocks is sent to the destination memory location.

Example Clause L, the system according to Example Clause K, wherein the data block identified by the descriptor in the first queue is identified by a direct memory access (DMA) descriptor.

Example Clause M, the system according to Example Clause K, wherein the data block identified by the descriptor in the first queue is a two-dimensional data block and the data block identified by the operation descriptor in the second queue is at least a two-dimensional data block, and the system is associated with a neural network.

Example Clause N, the system according to Example Clause J, wherein the data threshold is dynamically determined based on at least one input to a transfer function to generate the data threshold, the at least one input related to one or more functionalities associated with the system.

Example Clause O, a computer-readable storage medium having computer-executable instructions stored thereupon which, when executed by one or more processors of a computing device, cause the one or more processors of the computing device to: determine a data block is ready for transfer based on a descriptor in a first queue; analyze the descriptor in the first queue to determine at least one property associated with a dimension of the data block; and compare the at least one property associated with the dimension of the data block to a data threshold: when the at least one property associated with the dimension of the data block is greater than the data threshold, fragment the data block to generate at least a plurality of fragmented data blocks from the data block and send at least one of the plurality of fragmented data blocks to a destination memory location, and when the at least one property associated with the dimension of the data block is less than the data threshold, send the data block to the destination memory location unfragmented.

Example Clause P, the computer-readable storage medium of Example Clause O, wherein the data block has an X dimension in bytes and the data threshold is a byte value threshold, when the X dimension in bytes is less than or equal to the byte value threshold, fragment the data block to generate at least the plurality of fragmented data blocks from the data block and send the at least one of the plurality of fragmented data blocks to the destination memory location.

Example Clause Q, the computer-readable storage medium according to Example Clause P, wherein the data block has a Y dimension, and when the X dimension in bytes is less than or equal to the byte value threshold, fragment the data block in the Y dimension to generate the plurality of fragmented data blocks, each of the plurality of fragmented data blocks having a Y dimension that is smaller than the Y dimension of the data block.

Example Clause R, the computer-readable storage medium according to Example Clauses O through Q, wherein the data block has a Y dimension, and when the X dimension in bytes is less than or equal to the byte value threshold and the Y dimension is greater than one byte, fragment the data block in the Y dimension to generate the plurality of fragmented data blocks, each of the plurality of fragmented data blocks having a Y dimension that is smaller than the Y dimension of the data block.

Example Clause S, the computer-readable storage medium according to Example Clauses O through R, wherein the instructions cause the one or more processors of the computing device to determine a data block linked to a descriptor in a second queue is ready for transfer, and send the data block linked to the descriptor in the second queue to a memory location after the at least one of the plurality of fragmented data blocks is sent to the destination memory location.

In closing, although the various techniques have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:

1. A system for managing a plurality of queues, the system comprising:
   at least one processor; and
   at least one memory in communication with the at least one processor, the at least one memory having computer readable instructions stored thereupon that, when executed by the at least one processor, cause the at least one processor to:
   determine a data block is ready for transfer based on a descriptor in a first queue, the descriptor including a first dimension of the data block and a second dimension of the data block, each of the first and second dimensions being individual byte values;
   analyze the descriptor in the first queue to determine a dimension of the data block based on at least one of the first and second dimensions included in the descriptor; and
   compare the dimension of the data block to a data threshold:
   when the dimension of the data block is greater than the data threshold, fragment the data block to generate at least a plurality of fragmented data blocks from the data block and send at least one of the plurality of fragmented data blocks to a destination memory location,
   determine a second data block, identified by an operation descriptor in a second queue, is ready for transfer, and
   send at least a portion of the second data block identified by the operation descriptor to a memory location after the at least one of the plurality of fragmented data blocks is sent to the destination memory location, and
   when the dimension of the data block is less than the data threshold, send the data block to the destination memory location unfragmented.

2. The system according to claim 1, wherein the data block has an X dimension in bytes and the data threshold is a byte value threshold, when the X dimension in bytes is less than or equal to the byte value threshold, fragment the data block to generate at least the plurality of fragmented data blocks from the data block and send the at least one of the plurality of fragmented data blocks to the destination memory location.

3. The system according to claim 2, wherein the data block has a Y dimension, and when the X dimension in bytes is less than or equal to the byte value threshold, fragment the data block in the Y dimension to generate the plurality of fragmented data blocks, each of the plurality of fragmented data blocks having a Y dimension that is smaller than the Y dimension of the data block.

4. The system according to claim 2, wherein the data block has a Y dimension, and when the X dimension in bytes is less than or equal to the byte value threshold and the Y dimension is greater than one, fragment the data block in the Y dimension to generate the plurality of fragmented data blocks, each of the plurality of fragmented data blocks having a Y dimension that is smaller than the Y dimension of the data block.

5. The system according to claim 2, wherein the data block has a Y dimension, and when the Y dimension is greater than one, fragment the data block to generate at least the plurality of fragmented data blocks from the data block and send the at least one of the plurality of fragmented data blocks to the destination memory location.

6. The system according to claim 1, wherein the data block has an X dimension in bytes and a Y dimension, and the data threshold is a byte value threshold, when the Y dimension in bytes is equal to one and the X dimension in bytes is greater than the byte value threshold, fragment the data block in the X dimension to generate the plurality of fragmented data blocks, each of the plurality of fragmented data blocks having an X dimension in bytes that is smaller than the X dimension in bytes of the data block.

7. The system according to claim 1, wherein the data block identified by the descriptor in the first queue is identified by a direct memory access (DMA) descriptor.

8. The system according to claim 1, wherein the data block identified by the descriptor in the first queue is a two-dimensional data block and the data block identified by the operation descriptor in the second queue is at least a two-dimensional data block, and the system is associated with a neural network.

9. A system for managing a plurality of queues, the system comprising:
   at least one processor; and
   at least one memory in communication with the at least one processor, the at least one memory having computer readable instructions stored thereupon that, when executed by the at least one processor, cause the at least one processor to:
   determine a data block is ready for transfer based on a descriptor in a first queue, the descriptor including a first dimension of the data block and a second dimension of the data block, each of the first and second dimensions being individual byte values;
   analyze the descriptor in the first queue to determine a dimension of the data block based on at least one of the first and second dimensions included in the descriptor; and
   compare the dimension of the data block to a data threshold, the data threshold having been dynamically determined:
   when the dimension of the data block is greater than the data threshold, fragment the data block to generate at least a plurality of fragmented data blocks from the data block and send at least one of the plurality of fragmented data blocks to a destination memory location,
   determine a second data block, identified by an operation descriptor in a second queue, is ready for transfer, and
   send at least a portion of the second data block identified by the operation descriptor to a memory location after the at least one of the plurality of fragmented data blocks is sent to the destination memory location, and
   when the dimension of the data block is less than the data threshold, send the data block to the destination memory location unfragmented.

10. The system according to claim 9, wherein the data block identified by the descriptor in the first queue is identified by a direct memory access (DMA) descriptor.

11. The system according to claim 9, wherein the data block identified by the descriptor in the first queue is a two-dimensional data block and the data block identified by the operation descriptor in the second queue is at least a two-dimensional data block, and the system is associated with a neural network.

12. The system according to claim 9, wherein the data threshold is dynamically determined based on at least one input to a transfer function to generate the data threshold, the at least one input related to one or more functionalities associated with the system.

13. A computer-readable storage medium having computer-executable instructions stored thereupon which, when executed by one or more processors of a computing device, cause the one or more processors of the computing device to:
   determine a data block is ready for transfer based on a descriptor in a first queue, the descriptor including a first dimension of the data block and a second dimension of the data block, each of the first and second dimensions being individual byte values;
   analyze the descriptor in the first queue to determine a dimension of the data block based on at least one of the first and second dimensions included in the descriptor; and
   compare the dimension of the data block to a data threshold:
      when the dimension of the data block is greater than the data threshold, fragment the data block to generate at least a plurality of fragmented data blocks from the data block and send at least one of the plurality of fragmented data blocks to a destination memory location, and
      when the dimension of the data block is less than the data threshold, send the data block to the destination memory location unfragmented.

14. The computer-readable storage medium of claim 13, wherein the data block has an X dimension in bytes and the data threshold is a byte value threshold, when the X dimension in bytes is less than or equal to the byte value threshold, fragment the data block to generate at least the plurality of fragmented data blocks from the data block and send the at least one of the plurality of fragmented data blocks to the destination memory location.

15. The computer-readable storage medium according to claim 14, wherein the data block has a Y dimension, and when the X dimension in bytes is less than or equal to the byte value threshold, fragment the data block in the Y dimension to generate the plurality of fragmented data blocks, each of the plurality of fragmented data blocks having a Y dimension that is smaller than the Y dimension of the data block.

16. The computer-readable storage medium according to claim 14, wherein the data block has a Y dimension, and when the X dimension in bytes is less than or equal to the byte value threshold and the Y dimension is greater than one byte, fragment the data block in the Y dimension to generate the plurality of fragmented data blocks, each of the plurality of fragmented data blocks having a Y dimension that is smaller than the Y dimension of the data block.

17. The computer-readable storage medium according to claim 13, wherein the instructions cause the one or more processors of the computing device to determine a data block linked to a descriptor in a second queue is ready for transfer, and send the data block linked to the descriptor in the second queue to a memory location after the at least one of the plurality of fragmented data blocks is sent to the destination memory location.

* * * * *